United States Patent
Weng et al.

(10) Patent No.: US 10,303,310 B2
(45) Date of Patent: May 28, 2019

(54) IN-CELL TOUCH DISPLAY APPARATUS

(71) Applicant: HON HAI PRECISION INDUSTRY CO., LTD., New Taipei (TW)

(72) Inventors: Yu-Fu Weng, New Taipei (TW);
Chien-Wen Lin, New Taipei (TW);
Chia-Lin Liu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 133 days.

(21) Appl. No.: 15/245,904

(22) Filed: Aug. 24, 2016

(65) Prior Publication Data

US 2017/0344147 A1 Nov. 30, 2017

(30) Foreign Application Priority Data

May 25, 2016 (TW) .............................. 105116344 A

(51) Int. Cl.
*G06F 3/041* (2006.01)
*G06F 3/044* (2006.01)
*H01L 27/12* (2006.01)

(52) U.S. Cl.
CPC ............ *G06F 3/044* (2013.01); *G06F 3/0412* (2013.01); *G06F 3/0418* (2013.01); *H01L 27/124* (2013.01)

(58) Field of Classification Search
CPC ...... G06F 3/044; G06F 3/0418; G06F 3/0412; H01L 27/124
See application file for complete search history.

(56) References Cited

U.S. PATENT DOCUMENTS

| 9,024,913 B1* | 5/2015 | Jung | G06F 3/044 178/18.06 |
|---|---|---|---|
| 9,841,835 B2* | 12/2017 | Huang | G06F 3/0412 |
| 2012/0218199 A1* | 8/2012 | Kim | G06F 3/0412 345/173 |
| 2014/0240279 A1* | 8/2014 | Hwang | G06F 3/0412 345/174 |

FOREIGN PATENT DOCUMENTS

CN 104007869 A 8/2014

* cited by examiner

*Primary Examiner* — Jonathan A Boyd
(74) *Attorney, Agent, or Firm* — ScienBiziP, P.C.

(57) ABSTRACT

An in-cell touch display apparatus includes a substrate structure, a display driving integrated chip (IC), and a plurality of touch sensor units arranged in a matrix. Each of the touch sensor units includes a plurality of connecting lines of difference lengths and a plurality of compensating portions corresponding to the connecting lines in a one-to-one relationship. Each of the connecting lines establishes an electrical connection between the touch sensor unit and the display driving IC. The compensating portions are electrically connected to the display driving IC. The connecting lines and the compensating portions receive a common voltage from the display driving IC during the display period. A sum of the lengths of the connecting line and the compensating portion is constant throughout the plurality of connecting lines so as to compensate for different capacitances of the connecting lines.

9 Claims, 7 Drawing Sheets

IN-CELL TOUCH DISPLAY APPARATUS

CROSS-REFERENCE TO RELATED APPLICATIONS

This application claims priority to Taiwanese Patent Application No. 105116344 filed on May 25, 2016, the contents of which are incorporated by reference herein.

FIELD

The subject matter herein generally relates to an in-cell touch display apparatus.

BACKGROUND

As shown in related art in FIG. 7, an in-cell touch display apparatus 700 includes a display driving integrated chip (IC) 703, a plurality of touch sensor units 705 in a matrix, and a substrate 707. Each of the touch sensor units 705 is electrically connected to the display driving IC 703 through a connecting line 708 extended from the touch sensor unit 705. However, a better structure of the in-cell touch display apparatus is needed for acquiring greater uniformity and a greater brightness of the display effect. Therefore, there is room for improvement within the art.

BRIEF DESCRIPTION OF THE FIGURES

Implementations of the present technology will now be described, by way of example only, with reference to the attached figures.

DETAILED DESCRIPTION

Figure 1:
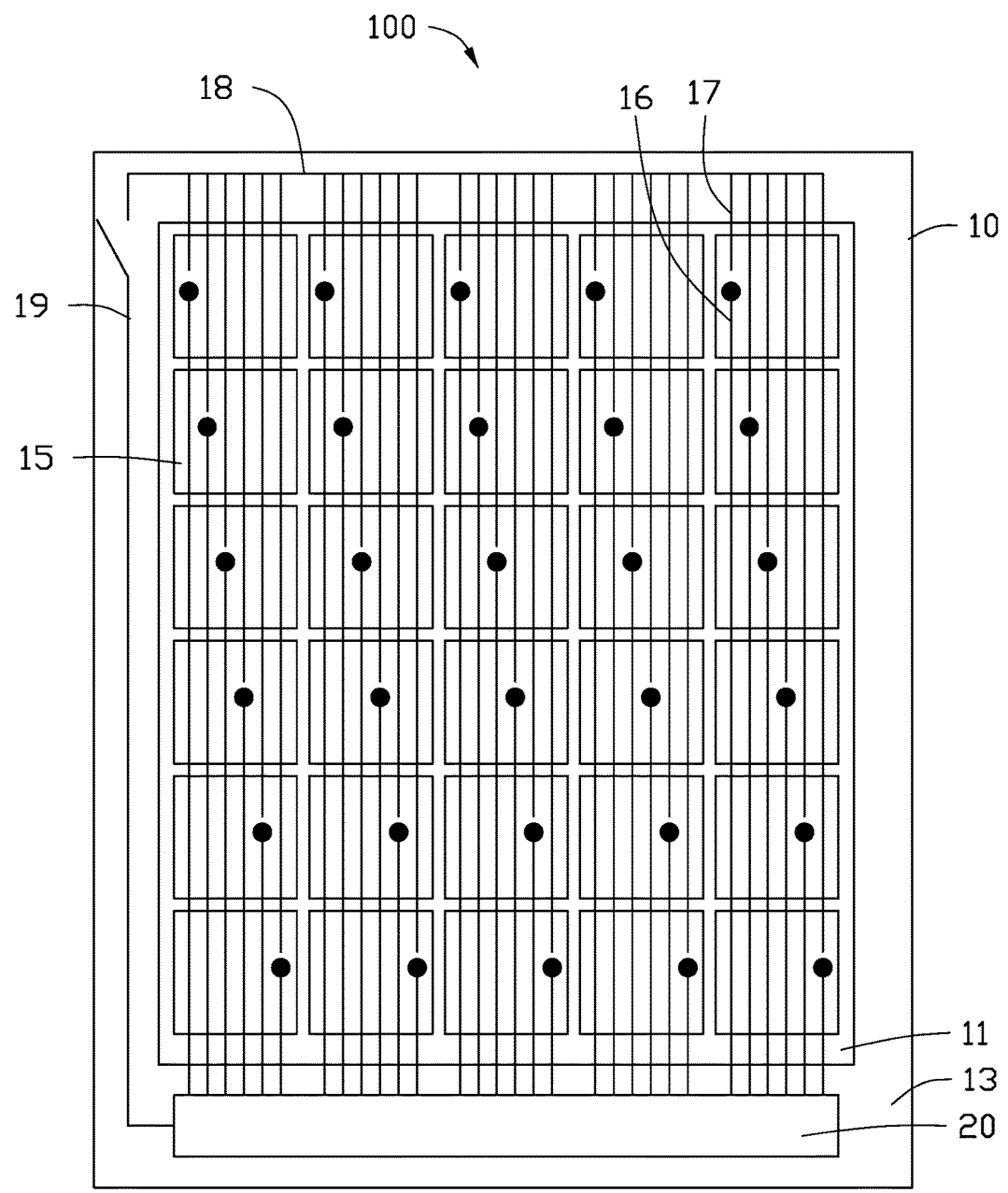
FIG. 1 is a plan view of a first exemplary embodiment of an in-cell touch display apparatus comprising a switch.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

The present disclosure is described in relation to an in-cell touch display apparatus.

FIG. 1 illustrates a first exemplary embodiment of an in-cell touch display apparatus 100. The in-cell touch display apparatus 100 can be, for example, a liquid crystal display (LCD) panel having a touch function. The in-cell touch display apparatus 100 includes a substrate structure 10, a plurality of touch sensor units 15 formed on the substrate structure 10, and a display driving integrated chip (IC) 20 positioned on the substrate structure 10.

The substrate structure 10 defines a display region 11 and a non-display region 13 surrounding the display region 11. In at least one embodiment, the substrate structure 10 may include two separated substrates and a liquid crystal layer positioned between the two separated substrates. One of the substrates can be a thin film transistor (TFT) array substrate. The touch units 15 are integrated into the substrate structure 10. The substrate structure 10 comprises a plurality of data lines, a plurality of scan lines crossed with the data lines to define a plurality of pixels, and a plurality of pixel electrodes corresponding to the pixels.

The touch sensor units 15 are positioned in the display region 11 and are arranged in a matrix of rows and columns and spaced at intervals from each other. Each of the touch sensor units 15 is substantially rectangular. The touch sensor units 15 can serve as a common electrode on the substrate structure 10 to drive liquid crystals during a display period, and serve as a touch electrode for sensing touch operations during a touch period. In at least one embodiment, the touch sensor unit 15 is substantially square, and a length of each of the touch sensor units 15 is in a range of 4-6 mm. Each touch sensor unit 15 is electrically connected to the display driving IC 20 through a connecting line 16. The connecting lines 16 are positioned on the touch sensor units 15. The connecting lines 16 are parallel to each other, and extend along a first direction towards the display driving IC 20. Distances between two adjacent connecting lines 16 connected to the touch sensor units 15 in the same column are substantially the same. Lengths of the connecting lines 16 in the same column are different from each other. For example, in one column, the length of the connecting lines 16 decreases with the decrease of distance between the touch sensor unit 15 and the display driving IC 20. Each connecting line 16 and touch sensor unit 15 can function as a first parasitic capacitor. The capacitances of the first parasitic capacitors are different from each other.

The in-cell touch display apparatus 100 further comprises a plurality of compensating portions 17. Each of the compensating portions 17 corresponds to the connecting lines 16 in a one-to-one relationship. Apparatus 100 also comprises a common line 18 and a switch 19 electrically connected between the common line 18 and the display driving IC 20. The compensating portions 17 are positioned on the touch sensor units 15. All the compensating portions 17 are electrically connected to the same switch 19 through the common line 18. Each compensating portion 17 is an electrically conductive line. The compensating portions 17 are parallel to each other, and extend along a second direction away from the display driving IC 20. Each compensating portion 17 is electrically insulated from the touch sensor units 15. In at least one embodiment, the compensating portion 17 is a straight line. Each compensating portion 17 and the corresponding connecting line 16 extend along a line and do not connect to one another. Distances between any two adjacent compensating portions 17 in the same column are substantially the same. Lengths of the compensating portions 17 in the same column are different from each other. In the same column, the length of the compensating portion 17 increases with the decrease of distance between the touch sensor unit 15 and the display driving IC 20. A sum of the lengths of each of the connecting lines 16 and the corresponding compensating portion 17 is constant. Each compensating portions 17 and touch sensor unit 15 can function as a second parasitic capacitor. A sum of the capacitances of any first parasitic capacitor and the corresponding second parasitic capacitor is constant.

The common line 18 is positioned in the non-display region 13 and electrically connected to all the compensating portions 17. The common line 18 is electrically connected to the display driving IC 20 through the switch 19. The common line 18 is used for transmitting a common voltage generated by the display driving IC 20 to the compensating portions 17.

The switch 19 is capable of switching between a switched-on state and a floating state.

The display driving IC 20 is positioned in the non-display region 13. The display driving IC 20 and the common line 18 are set on opposite ends of the non-display region 13. The display driving IC 20 controls the switch 19 to switch between the switched-on state and the floating state. The display driving IC 20 can provide the common voltage to the compensating portion 17 and the touch sensor units 15, and further provide scan signals to the touch sensor units 15 through the connecting lines 16.

Figure 2:
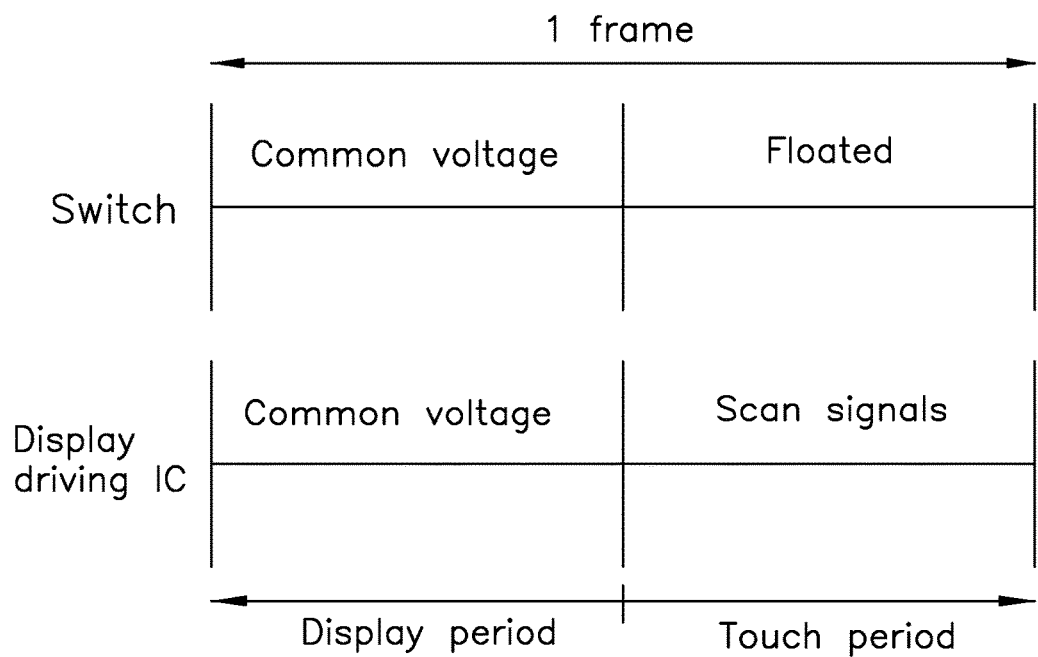
FIG. 2 is a diagram of a time driving sequence and a state of the switch of the in-cell touch display apparatus of FIG. 1.

FIG. 2 illustrates a time sequence of the display driving IC 20 and the states of the switch 19 of the in-cell touch display apparatus 100 during one frame time. The frame time is divided into the display period and the touch period. During the display period, the display driving IC 20 controls the switch 19 to switch on, and further provides a common voltage to the touch sensor units 15 through the connecting lines 16 and the compensating portions 17 and through the common line 18 and the switch 19. A sum of the capacitances of the first parasitic capacitor, formed by the connecting line 16, and the second parasitic capacitor, formed by the corresponding compensating portion 17, is constant. That is, a sum of the capacitances formed by any one of the touch sensor units 15 and the corresponding connecting line 16 and compensating portion 17 is constant.

During the touch period, the display driving IC 20 places the switch 19 in a floating state, and further provides scan signals to the touch sensor units 15 through the connecting line 16. The compensating portions 17 are floated to prevent the compensating portions 17 from becoming a second parasitic capacitor.

Figure 3:
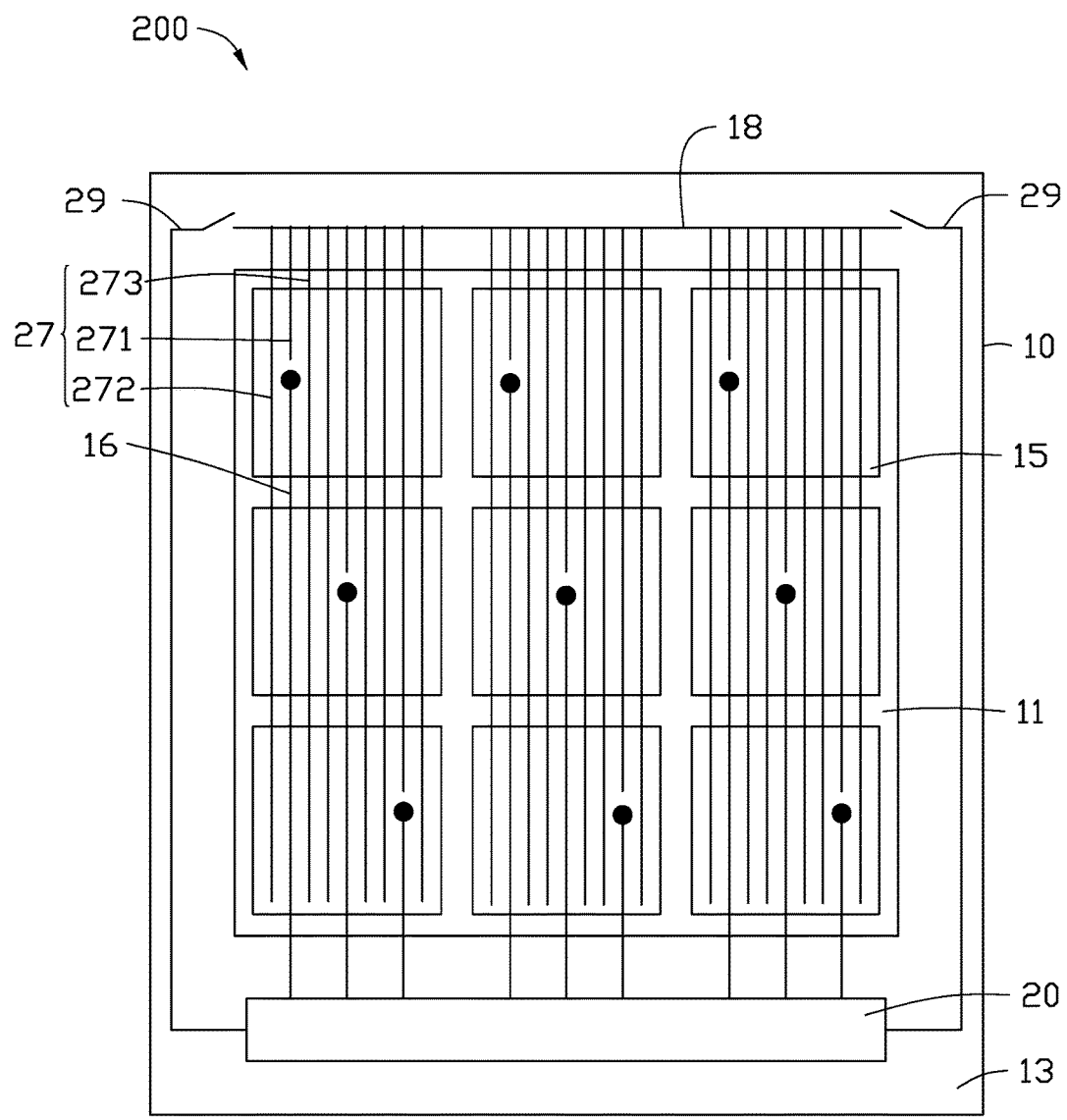
FIG. 3 is a plan view of a second exemplary embodiment of an in-cell touch display apparatus.

FIG. 3 illustrates a second exemplary embodiment of the in-cell touch display apparatus 200. The in-cell touch display apparatus 200 is similar to the in-cell touch display apparatus 100. The in-cell touch display apparatus 200 comprises a substrate structure 10, a touch sensor units 15, a connecting lines 16 positioned on the touch sensor units 15, a common line 18, and a display driving IC 20. The substrate structure 10 comprises a display region 11 and a non-display region 13.

The difference between the in-cell touch display apparatus 200 and the in-cell touch display apparatus 100 is that the in-cell touch display apparatus 200 further comprises a plurality of compensating portions 27 each of the compensating portions 27 corresponding to the connecting lines 16 in a one-to-one relationship. Apparatus 200 also comprises a common line 18 and two switches 29 connected to the common line 28. The compensating portions 27 are electrically insulated from the touch sensor units 15. All the compensating portions 27 are electrically connected to the same common line 18. Each compensating portions 27 and touch sensor unit 15 can function as a second parasitic capacitor. A sum of the capacitances of the first parasitic capacitor and the corresponding second parasitic capacitor is constant.

The compensating portions 27 are positioned on the touch sensor units 15 and electrically insulated from the touch sensor units 15. The compensating portions 27 are parallel to each other. Each of the compensating portions 27 includes a main line 271 corresponding to the connecting line 16, a first auxiliary line 272, and a second auxiliary line 273. The first auxiliary line 272 and the second auxiliary line 273 extend along a second direction away from the display driving IC 20. The main line 271 and the corresponding connecting line 16 extend along a line and do not connect to one another. Distances between two adjacent main lines 271 are substantially the same. Lengths of the main lines 271 in the same column are different from each other. In the same column, the length of the main line 271 increases with the decrease of distance between the touch sensor unit 15 and the display driving IC 20. The first auxiliary line 272 and the second auxiliary line 273 are positioned on opposite sides of the main line 271 and electrically connected to the common line 18. The first auxiliary line 272 and the second auxiliary line 273 have substantially the same lengths. A sum of the lengths of any connecting line 16 and the corresponding main line 271 is constant and almost equal to the length of the first auxiliary line 272 or the second auxiliary line 273.

The two switches 29 are electrically connected to each other through the common line 18 and the display driving IC 20. Each switch 29 is capable of switching between a switched-on state and a floating state.

During the display period, the display driving IC 20 places the switches 29 to a switched on state, and further provides a common voltage to the compensating portions 27 through the common line 18 and the switches 29. A sum of the capacitances of the first parasitic capacitor formed by the connecting line 16 and the second parasitic capacitor formed by the corresponding compensating portion 27 is constant. That is, a sum of the capacitances formed by any touch sensor unit 15 and the corresponding connecting line 16 and compensating portion 17 is constant.

During the touch period, the display driving IC 20 places the switches 29 in a floated state, and further provides the scan signals to the touch sensor units 15 through the connecting lines 16. The compensating portions 27 are floated to prevent the compensating portions 27 from becoming a second parasitic capacitor.

Figure 4:
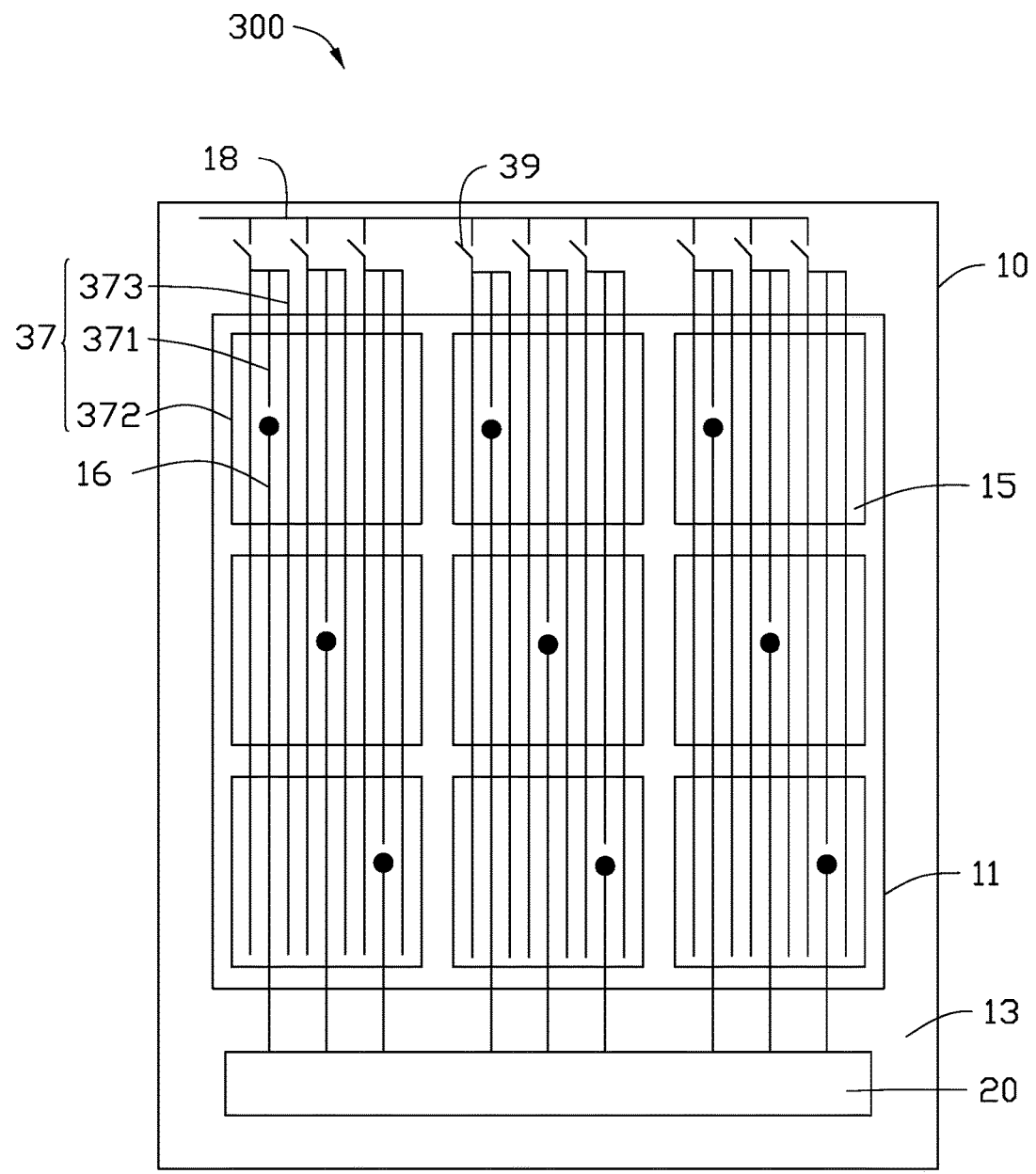
FIG. 4 is a plan view of a third exemplary embodiment of an in-cell touch display apparatus.

FIG. 4 illustrates a third exemplary embodiment of the in-cell touch display apparatus 300. The in-cell touch display apparatus 300 is similar to the in-cell touch display apparatus 100. The in-cell touch display apparatus 300 comprises a substrate structure 10, a touch sensor units 15, a connecting lines 16 positioned on the touch sensor units 15, a common line 18, and a display driving IC 20. The substrate structure 10 comprises a display region 11 and a non-display region 13.

The difference between the in-cell touch display apparatus 300 and the in-cell touch display apparatus 100 is that the in-cell touch display apparatus 300 further comprises a plurality of compensating portions 37. Each of the compensating portions 37 corresponds to the connecting lines 16 in a one-to-one relationship. Apparatus 300 also comprises a common line 18, and a plurality of switches 39 corresponding to the connecting lines 16 in a one-to-one relationship. Each of the compensating portions 37 is electrically connected to the common line 18 through a switch 39. Each compensating portion 37 and touch sensor unit 35 can function as a second parasitic capacitor. The capacitances of the second parasitic capacitors are different from each other, and are used for compensating for a capacitance of the first parasitic capacitors formed by the connecting lines 16.

The compensating portions 37 are positioned on the touch sensor units 15 and electrically insulated from the touch sensor units 15. The compensating portions 37 are parallel to each other. Each of the compensating portions 37 includes a main line 371 corresponding to the connecting line 16, a first auxiliary line 372, and a second auxiliary line 373. The first auxiliary line 372 and the second auxiliary line 373 extend along a second direction away from the display driving IC 20. A terminal of the main line 371 away from the display driving IC 20 and a terminal of the second auxiliary line 373 away from the display driving IC 20 are electrically connected to the first auxiliary line 372. The main line 371 and the connecting line 16 extend along a line and do not connect to one another. Distances between any two adjacent main lines 371 are substantially the same. Lengths of the main lines 371 in the same column are different from each other. In the same column, the length of the main line 371 increases with the decrease of distance between the touch sensor unit 15 and the display driving IC 20. The first auxiliary line 372 and the second auxiliary line 373 are positioned on opposite sides of the main line 371. The first auxiliary line 372 and the corresponding switch 39 are arranged in a line. The first auxiliary line 372 and the second auxiliary line 373 have substantially the same length. A sum of the lengths of any connecting line 16 and the corresponding main line 371 is constant and almost equal to the length of the first auxiliary line 372 or the second auxiliary line 373.

Each switch 39 is electrically connected between the first auxiliary line 371 and the common line 18. Each switch 39 is capable of switching between a switched-on state and a floated state.

During the display period, the display driving IC 20 places the switches 39 to a switched on state, and further provides the common voltage to the compensating portions 37 through the common line 18 and the switch 39. A sum of the capacitances of the first parasitic capacitor formed by the connecting line 16 and the second parasitic capacitor formed by the compensating portion 37 is constant.

During the touch period, the display driving IC 20 places the switches 39 to a floating state, and further provides the scan signals to the touch sensor units 15 through the connecting lines 16. The compensating portions 37 are floated to prevent the compensating portions 37 from becoming a second parasitic capacitor.

Figure 5:
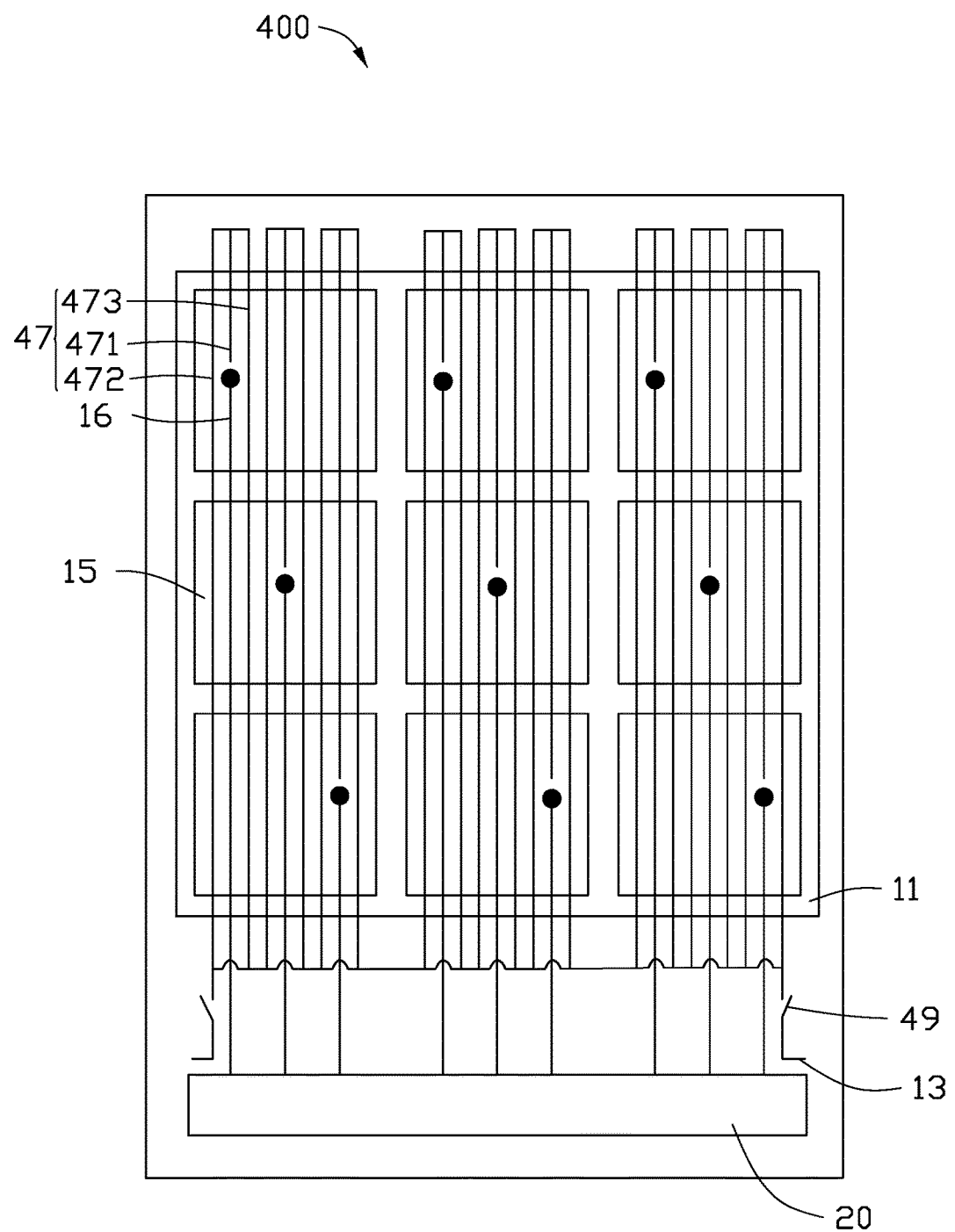
FIG. 5 is a plan view of a fourth exemplary embodiment of an in-cell touch display apparatus.

FIG. 5 illustrates a fourth embodiment of the in-cell touch display apparatus 400. The in-cell touch display apparatus 400 is similar to the in-cell touch display apparatus 100. The in-cell touch display apparatus 400 comprises a substrate structure 10, a touch sensor units 15, a connecting lines 16 positioned on the touch sensor units 15, and a display driving IC 20. The substrate structure 10 comprises a display region 11 and a non-display region 13.

The difference between the in-cell touch display apparatus 400 and the in-cell touch display apparatus 100 is that the in-cell touch display apparatus 400 further comprises a plurality of compensating portions 47. Each of the compensating portions 47 corresponds to the connecting lines 16 in a one-to-one relationship and a plurality of switches 49 corresponding to the connecting lines 16 in a one-to-one relationship. Each compensating portions 47 is electrically connected to the display driving IC 20 through a switch 49. Each compensating portion 47 and touch sensor unit 45 can function as a second parasitic capacitor. The capacitances of the second parasitic capacitors are different from each other, and are used for compensating for a capacitance of the first parasitic capacitors formed by the connecting lines 16.

The compensating portions 47 are positioned on the touch sensor units 15 and electrically insulated from the touch sensor units 15. The compensating portions 47 are parallel to each other. Each of the compensating portions 47 includes a main line 471 corresponding to the connecting line 16, a first auxiliary line 472, and a second auxiliary line 473. The first auxiliary line 472 and the second auxiliary line 473 extend along a second direction away from the display driving IC 20. The main line 471 and the second auxiliary line 473 are electrically connected to the first auxiliary line 472 in parallel. The main line 471 and the connecting line 16 extend along a line and do not connect to one another. Distances between two adjacent main lines 471 are substantially the same. Lengths of the main lines 471 in the same column are different from each other. In the same column, the length of the main line 471 increases with the decrease of distance between the touch sensor unit 15 and the display driving IC 20. The first auxiliary line 472 and the second auxiliary line 473 are positioned on opposite sides of the main line 471. The first auxiliary line 472 and the switch 49 extend along a line. The first auxiliary line 472 and the second auxiliary line 473 of each compensating portion 47 have substantially the same lengths. A sum of the lengths of any one connecting line 16 and the main line 471 is constant and almost equal to the length of the first auxiliary line 472 or the second auxiliary line 473.

Each switch 49 is connected between a first auxiliary line 472 and a terminal of the display driving IC 20. The switch 49 is capable of switching between a switched-on state and a floated state.

During the display period, the display driving IC 20 places the switches 49 to a switched on, and further provides a common voltage to the compensating portions 47 through the switches 49. A sum of the capacitances of the first parasitic capacitor formed by the connecting line 16 and the second parasitic capacitor formed by the compensating portion 47 is constant.

During the touch period, the display driving IC 20 places the switches 49 to a floated state, and further provides the scan signals to the touch sensor units 15 through the connecting lines 16. The compensating portions 47 are floated to prevent the compensating portions 47 from becoming a second parasitic capacitor.

Figure 6:
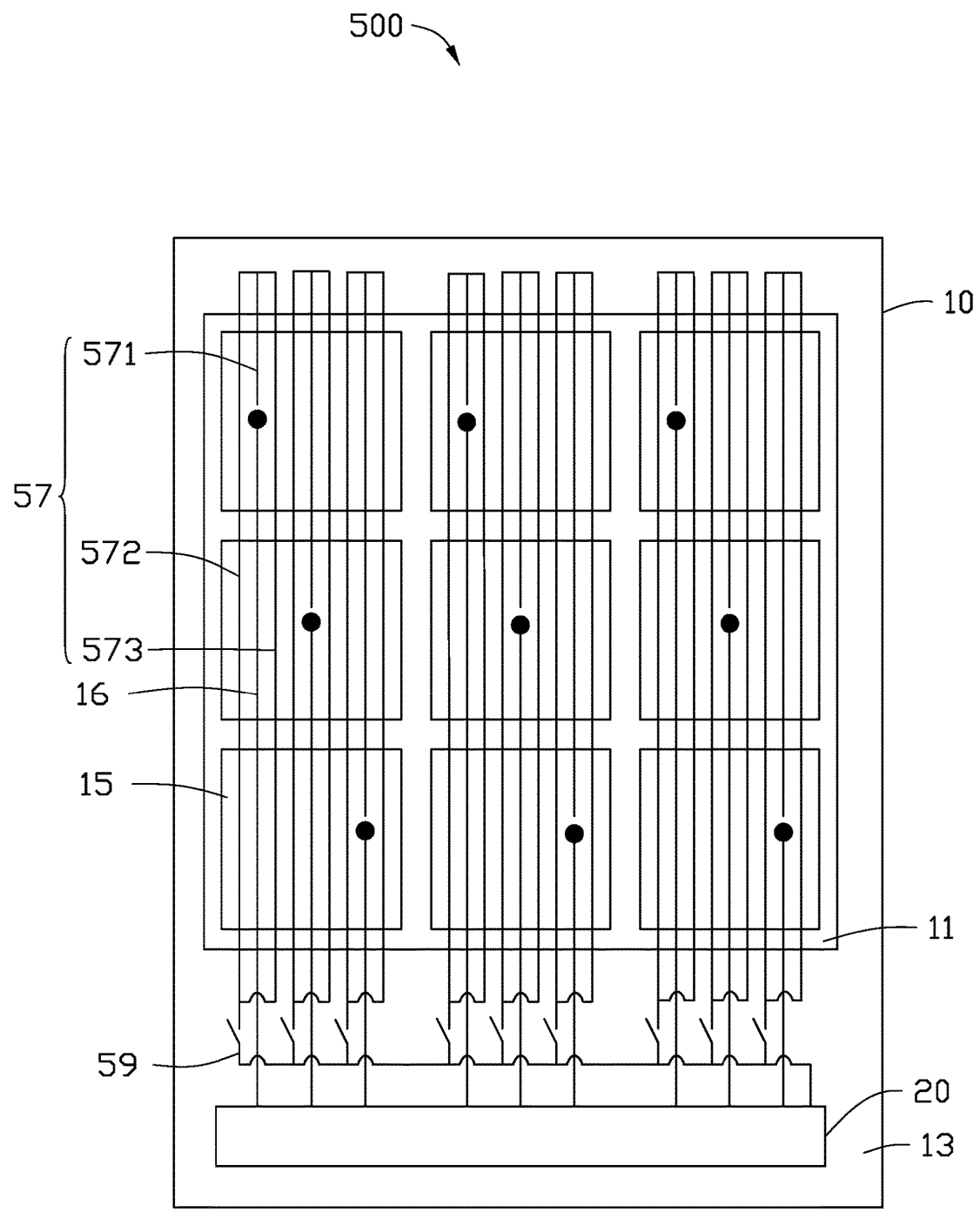
FIG. 6 is a plan view of a fifth exemplary embodiment of an in-cell touch display apparatus.
Figure 7:
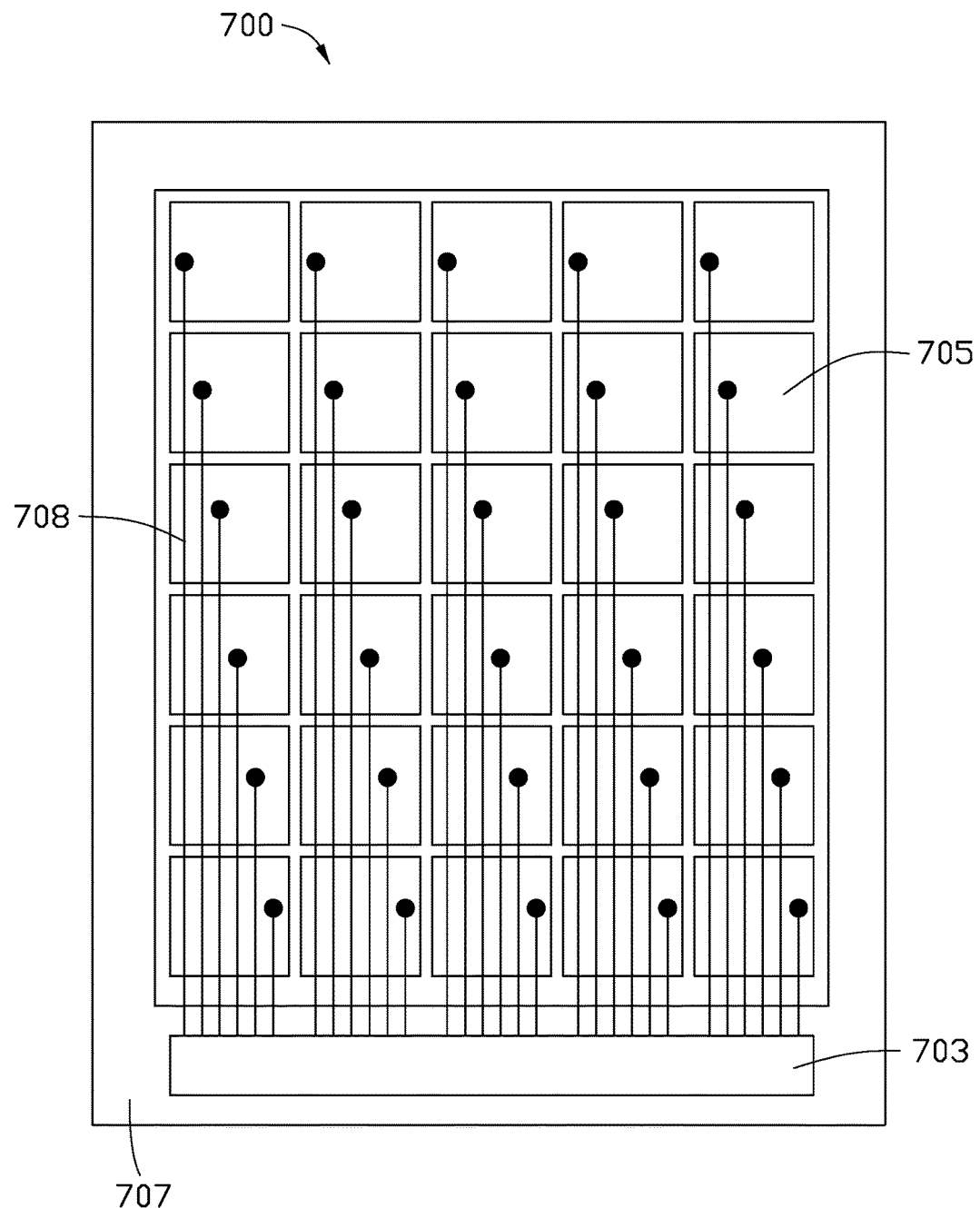
FIG. 7 is a plan view of an in-cell touch display apparatus of related art.

FIG. 6 illustrates a fifth embodiment of the in-cell touch display apparatus 500. The in-cell touch display apparatus 500 is similar to the in-cell touch display apparatus 100. The in-cell touch display apparatus 400 comprises the substrate structure 10, the touch sensor units 15, the connecting lines 16 positioned on the touch sensor units 15, and the display driving IC 20. The substrate structure 10 comprises the display region 11 and the non-display region 13.

The difference between the in-cell touch display apparatus 500 and the in-cell touch display apparatus 100 is that the in-cell touch display apparatus 500 further comprises a plurality of compensating portions 57 corresponding to the connecting lines 16 in a one-to-one relationship and a plurality of switches 59 corresponding to the connecting lines 16 in a one-to-one relationship. Each compensating portions 57 is electrically connected to the display driving IC 20 through a switch 59. Each compensating portion 57 and touch sensor unit 55 can function as a second parasitic capacitor. The capacitances of the second parasitic capacitors are different from each other, and are used for compensating for a capacitance of the first parasitic capacitors formed by the connecting lines 16.

The compensating portions 57 are positioned on the touch sensor units 15 and electrically insulated from the touch sensor units 15. The compensating portions 57 are parallel to each other. Each of the compensating portions 57 includes a main line 571 corresponding to the connecting line 16, a first auxiliary line 572, and a second auxiliary line 573. The first auxiliary line 572 and the second auxiliary line 573 extend along a second direction away from the display driving IC 20. The main line 571 and the second auxiliary line 573 are electrically connected to the first auxiliary line 572 in parallel. The main line 571 and the connecting line 16 extend along a line and do not connect to one another. Distances between adjacent main lines 571 are substantially the same. Lengths of the main lines 571 are different from each other. In the same column, the length of the main line 571 increases with the decrease of distance between the touch sensor unit 15 and the display driving IC 20. The first auxiliary line 572 and the second auxiliary line 573 are positioned on opposite sides of the main line 571. The first auxiliary line 572 and the switch 59 are arranged in a line. The first auxiliary line 572 and the second auxiliary line 573 of each compensating portion 57 have substantially the same lengths. A sum of the lengths of one connecting line 16 and the main line 571 is constant, and is similar to the length of the first auxiliary line 572 or the second auxiliary line 573.

Each switch 59 is capable of switching between a switched-on state and a floated state. The switches 59 are electrically connected to the same terminal of the display driving IC 20 and the first auxiliary line 572.

During the display period, the display driving IC 20 places the switches 59 to a switched-on state, and further provides a common voltage to the compensating portions 57 through the switches 59. A sum of the capacitances of the first parasitic capacitor formed by the connecting line 16 and the second parasitic capacitor formed by the compensating portion 57 is constant. That is, a sum of the capacitances formed by any one of the touch sensor units 15 and the connecting line 16 and compensating portion 57 is constant.

During the touch period, the display driving IC 20 places the switch 59 to a floated state, and further provides the scan signals to the touch sensor units 15 through the connecting lines 16. The compensating portions 57 are floated to prevent the compensating portions 57 from becoming a second parasitic capacitor.

Based on the structure of in-cell touch display apparatus 100, a parasitic capacitance formed by the connecting line is compensated for by the compensating portion thus uniformity and brightness of the in-cell touch display apparatus 100 is improved.

While various exemplary and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. An in-cell touch display apparatus comprising:
a substrate structure;
a display driving integrated chip (IC) positioned on the substrate structure to provide a common voltage in a display period, and provide scan signals in a touch period;
a plurality of touch sensor units arranged in a matrix on the substrate structure, wherein each touch sensor unit is spaced apart from each other and configured to receive the common voltage and the scan signals;
a plurality of connecting lines, wherein each of the plurality of connecting lines is electrically coupled between the display driving IC and one of the plurality of touch sensor units; each of the plurality of connecting lines extends in a first direction;
a plurality of compensating portions, wherein each of the plurality of compensating portions extends in the first direction and aligns with one of the plurality of connecting lines; each of the plurality of compensating portions is electrically insulated from the plurality of connecting lines and the plurality of touch sensor units;
wherein the connecting lines and the compensating portions receive a common voltage from the display driving IC during the display period.

2. The in-cell touch display apparatus of claim 1, wherein the plurality of compensating portions are electrically conductive.

3. The in-cell touch display apparatus of claim 2, wherein the plurality of touch sensor units are arranged in a plurality of columns; the lengths of the connecting lines electrically coupled one same column of the touch sensor units are different from each other.

4. The in-cell touch display apparatus of claim 3, wherein each of the plurality of connecting lines and its aligning one compensating portion are spaced apart from each other.

5. The in-cell touch display apparatus of claim 4, wherein a sum length of each of the plurality of connecting lines and its aligning one compensating portion is constant.

6. The in-cell touch display apparatus of claim 4, further comprising a common line; wherein the common line is electrically coupled between the plurality of compensating portions and the display driving IC.

7. The in-cell touch display apparatus of claim 6, wherein a switch is electrically between the common line and the display driving IC.

8. The in-cell touch display apparatus of claim 6, further comprising a first auxiliary line and a second auxiliary line positioned on opposite sides of each of the plurality of compensating portions; wherein the first auxiliary line and the second auxiliary line are electrically coupled the common line and are electrically insulated from the plurality of touch sensor units.

9. The in-cell touch display apparatus of claim 8, wherein both the first auxiliary line and the second auxiliary line extend in the first direction.

* * * * *